United States Patent
Auyeung et al.

(10) Patent No.: US 8,643,401 B2
(45) Date of Patent: Feb. 4, 2014

(54) INTEGRATED CIRCUIT COMMUNICATION SYSTEM WITH DIFFERENTIAL SIGNAL AND METHOD OF MANUFACTURE THEREOF

(75) Inventors: On Auyeung, Singapore (SG); Fei Xu, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 130 days.

(21) Appl. No.: 12/432,162

(22) Filed: Apr. 29, 2009

(65) Prior Publication Data

US 2010/0276815 A1 Nov. 4, 2010

(51) Int. Cl.
*H03K 19/094* (2006.01)
*H03B 1/00* (2006.01)

(52) U.S. Cl.
USPC ............... 326/82; 326/86; 327/108; 327/109

(58) Field of Classification Search
USPC ................... 326/82–87; 327/108, 109
See application file for complete search history.

(56) References Cited

U.S. PATENT DOCUMENTS

| | | | |
|---|---|---|---|
| 6,028,467 A | 2/2000 | Burrows et al. | |
| 6,803,792 B2* | 10/2004 | Yasuda et al. | 326/93 |
| 6,965,256 B2* | 11/2005 | Cheng | 327/53 |
| 7,142,033 B2 | 11/2006 | Ghia et al. | |
| 7,190,192 B2 | 3/2007 | Haq | |
| 7,471,110 B2 | 12/2008 | Dixit et al. | |
| 2007/0030038 A1* | 2/2007 | McHugh et al. | 327/100 |
| 2007/0257712 A1* | 11/2007 | Einerman et al. | 327/108 |
| 2007/0290741 A1* | 12/2007 | Forbes et al. | 330/9 |
| 2008/0024174 A1* | 1/2008 | Wong et al. | 327/58 |

FOREIGN PATENT DOCUMENTS

EP 1064767 B8 5/2007

* cited by examiner

*Primary Examiner* — Thienvu Tran
(74) *Attorney, Agent, or Firm* — Ishimaru & Associates LLP

(57) ABSTRACT

A method of manufacture of an integrated circuit communication system including providing a semiconductor wafer; and fabricating a cross-over current mirror driver on the semiconductor wafer for generating a crossing point at a reference voltage.

20 Claims, 5 Drawing Sheets

INTEGRATED CIRCUIT COMMUNICATION SYSTEM WITH DIFFERENTIAL SIGNAL AND METHOD OF MANUFACTURE THEREOF

TECHNICAL FIELD

The present invention relates generally to an integrated circuit communication system, and more particularly to a system for chip to chip communication using differential signals.

BACKGROUND ART

In many of today's most popular electronic devices, such as cell phones, laptop computers, personal data organizers, and global positioning systems, chip to chip communication is a required element of the architecture. Data may be transmitted across short distances between integrated circuits within the device.

The transmission of data involves sending and receiving data over a transmission path, which is connected between a pair of transceivers. Each transceiver can have a receiver and a transmitter (or driver). In this manner, the receiver functions to receive data from the transmission path, whereas the transmitter functions to drive data onto the transmission path. The transfer of data between receiver and transmitter circuits fabricated on separate chips is sometimes referred to as "off-chip" signaling or "chip to chip" communication.

Single-ended signals are typically used for on-chip communication because of the reduced area consumption and design complexity generally involved in routing these signals. However, more and more off-chip signals, or signals used for chip to chip communication, are routed as differential signals because of their decreased sensitivity to environmental noise. For this reason, numerous transmission protocols such as Low Voltage Differential Signals (LVDS), Stub Series Terminated Logic (SSTL), differential High-Speed Transceiver Logic (HSTL) and Low Voltage Positive Referenced Emitter Coupled Logic (LVPECL) have been established for sending and receiving differential signals across a transmission path. These differential signals often have smaller amplitudes (i.e., reduced swings) to facilitate easier routing in high speed chip-to-chip communications. In addition, the common mode voltage (i.e., the average voltage value) of the differential signals often varies significantly from case to case depending on the actual application environment.

A differential receiver essentially operates as a differential sense amplifier that can ideally accept a relatively wide input common mode voltage range with a high common mode rejection ratio. However, as with most circuits, a practical sense amplifier has a limit as to the common mode voltage that it can accept. One of the difficulties in sensing the differential signal is the asymmetrical switching of the output lines due to process and switching speed variations in the transmitter. Process yield can be adversely impacted by a process corner that produces a characteristically fast p-channel Metal Oxide Semiconductor (pMOS) transistor coupled to a characteristically slow n-channel Metal Oxide Semiconductor (nMOS) transistor or vice versa.

The difficulty arises when the differential signals reach an equal voltage level that is distant and different from the reference voltage. This condition may produce shifted timing of the input data of the receiver, which may cause data corruption. Since the performance of the chip to chip communication may be impacted by temperature and voltage variations as well, maintaining tight process control is critical. Unfortunately normal statistical distribution occurs despite the efforts to produce only nominal speed devices. The current state of the art may render the devices, which are produced and fall outside of the nominal speed range, non-operational across their specified temperature and voltage ranges.

Thus, a need still remains for an integrated circuit communication system with differential signal that can increase the manufacturing yield of the chip to chip communication to include product that is fabricated outside the nominal process. In view of the increased demand for highly integrated functions that require chip to chip communication, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit communication system including providing a semiconductor wafer; and fabricating a cross-over current mirror driver on the semiconductor wafer for generating a crossing point at a reference voltage.

The present invention provides an integrated circuit communication system including: a semiconductor wafer; and a cross-over current mirror driver fabricated on the semiconductor wafer for generating a crossing point at a reference voltage.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
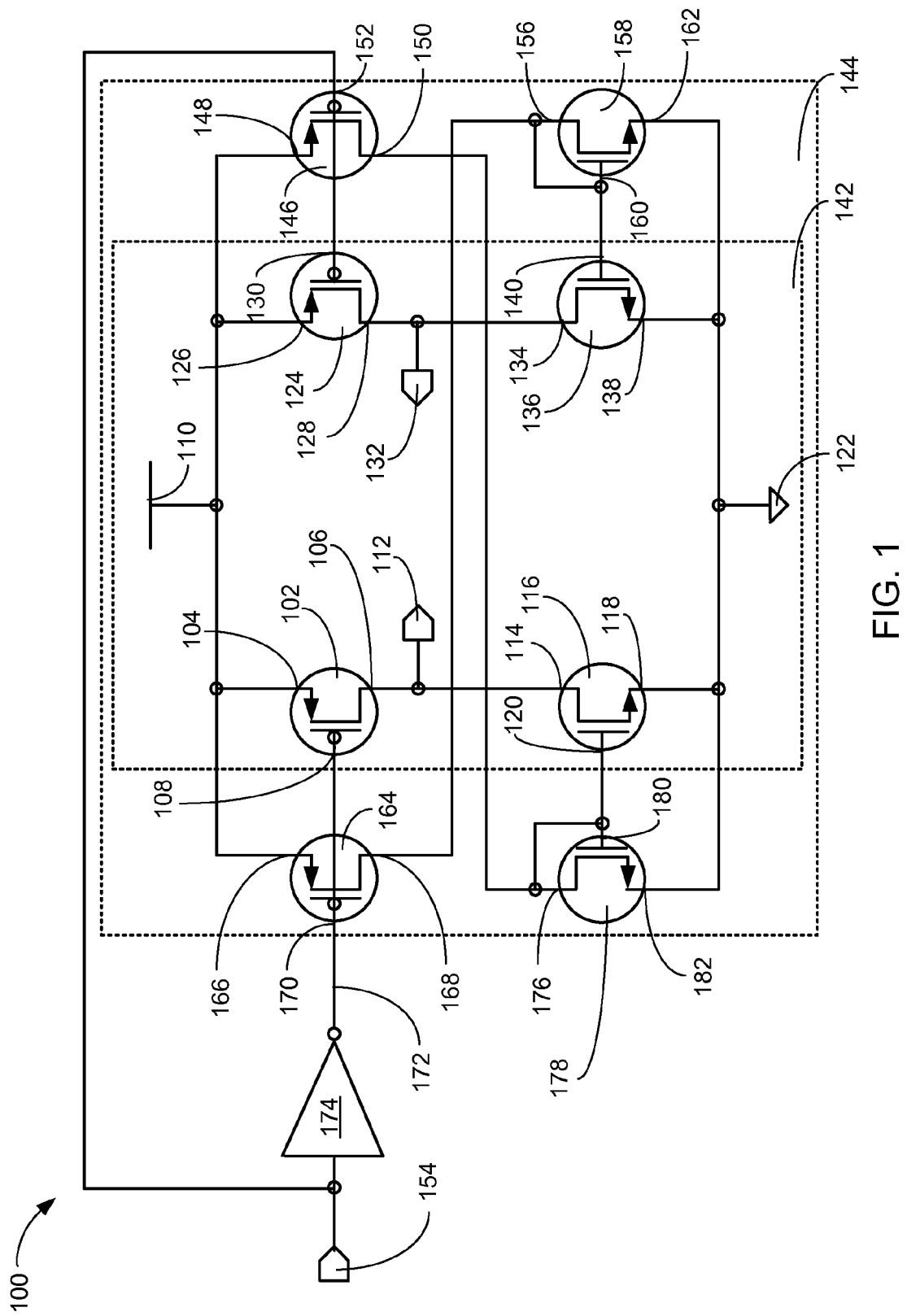
FIG. 1 is a schematic diagram of an integrated circuit communication system with differential signals, in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, the concentrations of dopants and chemicals, and/or removal of the material or photoresist as required in forming a described structure.

Referring now to FIG. 1, therein is shown a schematic diagram of an integrated circuit communication system 100 with differential signals, in an embodiment of the present invention. The schematic diagram of the integrated circuit communication system 100 depicts a first transistor 102, such as a p-channel metal oxide semiconductor (pMOS) transistor, having a first source 104, a first drain 106, and a first gate 108. The first source 104 may be coupled to a first source voltage 110.

The first source voltage 110 may be equal to 1.8 volts, 1.3 volts, or a similar positive voltage and may be coupled to the first source 104. The first drain 106 may be coupled to a positive output node 112 and a second drain 114 of a second transistor 116, such as an n-channel metal oxide semiconductor (nMOS) transistor, having a second source 118 and a second gate 120. The second source 118 of the second transistor may be coupled to a second voltage 122, such as ground.

A third transistor 124, such as a p-channel metal oxide semiconductor (pMOS) transistor, having a third source 126, a third drain 128 and a third gate 130, may be coupled in a substantially similar fashion as the first transistor 102. The third source 126 may be coupled to the first source voltage 110 but the third drain 128 may be coupled to a negative output node 132 and a fourth drain 134 of a fourth transistor 136.

The fourth transistor 136, such as an n-channel metal oxide semiconductor (nMOS) transistor, having the fourth drain 134, a fourth source 138 and a fourth gate 140, may be coupled in a substantially similar fashion as the second transistor 116. The fourth source 138 of the fourth transistor 136 may be coupled to the second voltage 122.

The configuration of the first transistor 102, the second transistor 116, the third transistor 124, and the fourth transistor 136 being appropriately coupled to the first source voltage 110, the second voltage 122, the positive output node 112, and the negative output node 132 may be considered to be a standard driver circuit 142. The standard driver circuit 142 is similar to the prior art driver circuit of the present state of the art.

The design of the transistors may be matched and they are fabricated in close proximity in order to minimize any characteristic variation in their performance, such as threshold voltage or current capacity. As previously described, variation in the switching performance may cause asymmetrical switching of the positive output node 112 and the negative output node 132, which may lead to data corruption.

In order to alleviate the process issues that may lead to asymmetrical switching, an embodiment of the present invention provides a cross-over current mirror driver 144. The cross-over current mirror driver 144 provides current tracking to the standard driver circuit 142, based on matching transistors, that is independent of the process corners and prevents the occurrence of asymmetrical switching.

The cross-over current mirror driver 144 may include fabricating the standard driver circuit 142 with a fifth transistor 146, such as a p-channel metal oxide semiconductor (pMOS) transistor, having a fifth source 148, a fifth drain 150, and a fifth gate 152. The fifth source 148 may be coupled to the first source voltage 110, and the fifth gate 152 may be coupled to the third gate 130 and an input node 154.

The input node 154 may be coupled to a signaling source (not shown) within the chip that contains the cross-over current mirror driver 144. A single ended signal (not shown) may switch in a specified pattern in order to activate the positive output node 112 and the negative output node 132 and thereby transfer information to a second chip.

The fifth drain 150 may be cross-coupled to an eighth drain 176 of an eighth transistor 178, such as an n-channel metal oxide semiconductor (nMOS) transistor, an eighth gate 180, and the second gate 120. An eighth source 182 may be coupled to the second voltage 122.

The cross-over current mirror driver 144 may also include fabricating a seventh transistor 164, such as a p-channel metal oxide semiconductor (pMOS) transistor, having a seventh source 166, a seventh drain 168, and a seventh gate 170. The seventh source 166 may be coupled to the first source voltage 110, and the seventh gate 170 may be coupled to the first gate 108 and an inverted input 172.

The inverted input 172, such as a single-ended input circuit, may be driven by an inverter 174 that is coupled between the input node 154 and the cross-over current mirror driver 144. The inverter 174 may be any high speed complimentary metal oxide semiconductor (CMOS) device. The inverter 174 may also have connections to the first source voltage 110 and the second voltage 122, but these connections have been omitted for clarity of the figure.

The seventh drain 168 may be cross-coupled to a sixth drain 156 of a sixth transistor 158, such as an n-channel metal oxide semiconductor (nMOS) transistor, a sixth gate 160, and the fourth gate 140. A sixth source 162 may be coupled to the second voltage 122.

It has been discovered that by coupling the fifth transistor 146, the sixth transistor 158, the seventh transistor 164, and the eighth transistor 178 in a cross-coupled configuration as described above, the positive output node 112 and the negative output node 132 will always switch symmetrically, such as the output crossing point being kept within the specification limits, independent of the process variations. This discovery may represent a significant increase in process yield delivering a reduction in cost of manufacture.

Thus, it has been discovered that the integrated circuit communication system and device of the present invention furnishes important and heretofore unknown and unavailable solutions, capabilities, and functional aspects for increasing the process yield for integrated circuits containing a differential driver without adding significant space to the design.

The invention is enabled by the fifth transistor 146 sourcing a first reference current to the eighth transistor 178 which is coupled to the second transistor 116 as a current mirror, such as a first current mirror. Any change in parametric capabilities in the transistors will be reflected in the reference current and thus regulate the transition of the positive output node 112 and the negative output node 132.

The same enabling takes place by the seventh transistor 164 sourcing a second reference current to the sixth transistor 158 which is coupled to the fourth transistor 136 as a current mirror, such as a second current mirror. The parametric characteristics of pMOS transistors, being the first transistor 102, the third transistor 124, the fifth transistor 146, and the seventh transistor 164, will always be matched because they are fabricated in close proximity on the integrated circuit (not shown).

The parametric characteristics of nMOS transistors, being the second transistor 116, the fourth transistor 136, the sixth transistor 158, and the eighth transistor 178, will always be matched because they are fabricated in close proximity on the integrated circuit (not shown). While the parametric characteristics of the pMOS transistors may be dramatically different from the parametric characteristics of the nMOS transistors, the configuration of the present invention maintains a symmetrical transition of the positive output node 112 and the negative output node 132.

The size of the transistors may be in a ratio such that the first transistor 102 may source the same amount of current that the fourth transistor 136 is capable of sinking. This balance of current handling capacity is necessary since the current flows from the first transistor 102 to the positive output node 112, through the external wiring (not shown), back into the negative output node 132 and through the fourth transistor 136. A similar crossing pattern is true for the third transistor 124 and the second transistor 116.

Thus it has been discovered that the integrated circuit communication system 100, of the present invention, provides a reliable and manufacturable differential driver for chip-to-chip communication that is not impacted by changes in the parametric characteristics caused by manufacturing process variations.

Figure 2:
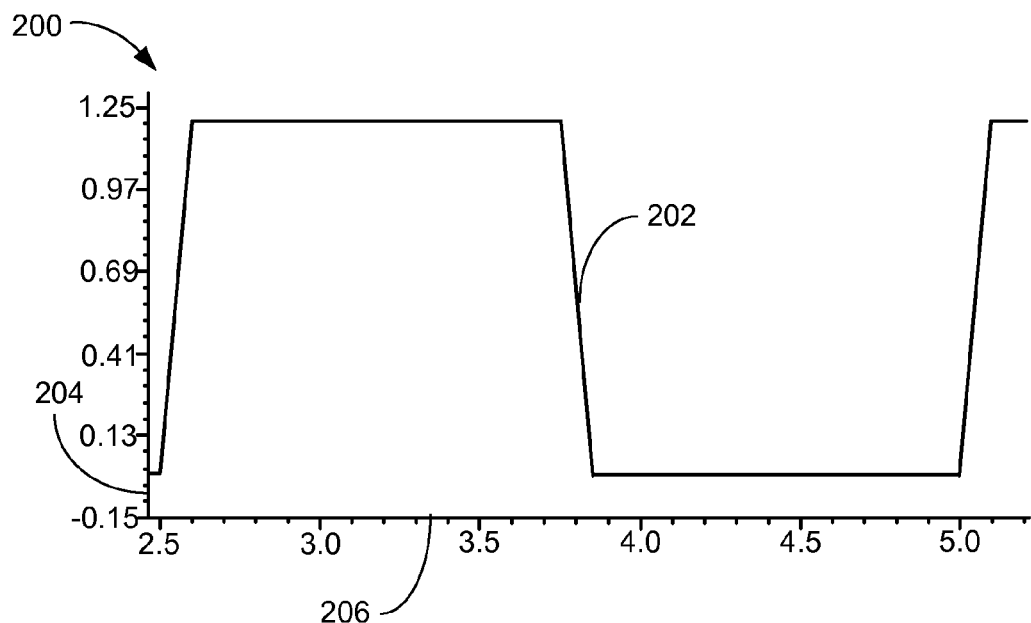
FIG. 2 is a timing diagram of an input waveform applied to the integrated circuit communication system, of FIG. 1.

Referring now to FIG. 2, therein is shown a timing diagram of an input waveform 200 applied to the integrated circuit communication system 100, of FIG. 1. The timing diagram of the input waveform 200 depicts a single ended signal 202 that may be transmitted from a first integrated circuit (not shown) to a second integrated circuit (not shown). A voltage scale 204 may indicate the voltage level of the single ended signal 202 and a time scale 206 shows the relative timing, measured in nano-seconds, of the transitions in the single ended signal 202.

Figure 3:
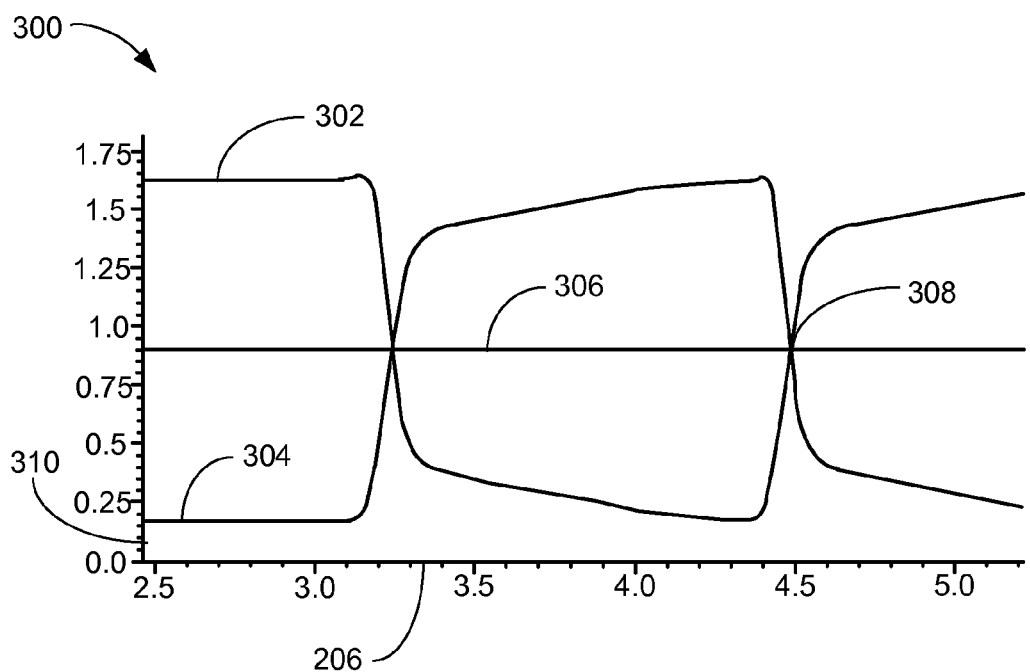
FIG. 3 is a timing diagram of an output waveform sourced from the integrated circuit communication system having transistors from a nominal process.

Referring now to FIG. 3, therein is shown a timing diagram of an output waveform 300 sourced from the integrated circuit communication system 100 having transistors from a nominal process. The timing diagram of the output waveform 300 depicts a negative output waveform 302 and a positive output waveform 304.

A reference voltage 306 equal to half of the first source voltage 110, of FIG. 1, is a specified crossing point 308. The specified crossing point 308 is the point at which the voltage of the negative output waveform 302 is equal to the voltage of the positive output waveform 304.

The negative output waveform 302 and the positive output waveform 304 are displayed with a voltage scale 310 in the vertical axis and the time scale 206 in the horizontal axis. This set of wave forms is by way of an example only and while the voltage levels displayed are consistent for the first source voltage 110 equal to +1.8 Volts, other values may be used for the first source voltage 110. While the transition times and wave shapes are for this example, other transition times may represent other information, such as clock signals or data lines.

The negative output waveform 302 and the positive output waveform 304 may represent an integrated circuit manufactured from a nominal manufacturing process (not shown).

Figure 4:
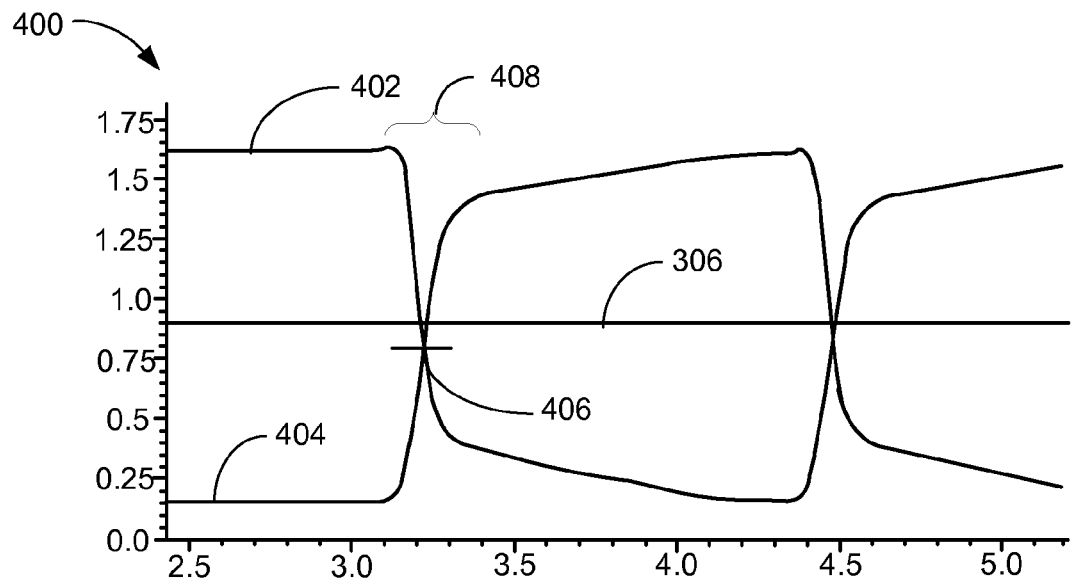
FIG. 4 is a timing diagram of an output waveform sourced from a prior art driver circuit, having transistors outside the nominal process.

Referring now to FIG. 4, therein is shown a timing diagram of an output waveform 400 sourced from a prior art driver circuit (not shown), having transistors outside the nominal process. The timing diagram of the output waveform 400 depicts a negative output waveform 402 and a positive output waveform 404. While the negative output waveform 402 and the positive output waveform 404 are similar to the negative output waveform 302, of FIG. 3, and the positive output waveform 304, of FIG. 3, their crossing point 406 is shifted from the reference voltage 306.

This shifting of the crossing point 406 may be caused by a manufacturing process corner that produces pMOS transistors that are characteristically fast and nMOS transistors that are characteristically slow or vice versa. In this situation the rise and fall times of a transition region 408 may become asymmetrical leading to the shift of the crossing point 406 to be away from the reference voltage 306.

The shape of the negative output waveform 402 and the positive output waveform 404 is an example only and may vary based on the parametric characteristics of the pMOS transistors and the nMOS transistors, the inductance of the interconnect traces, and the capacitance of the receiver circuitry in the other integrated circuit (not shown). Of significance to the data transfer is the crossing point 406 of the negative output waveform 402 and the positive output waveform 404 as seen by the receiver (not shown).

Industrial standards for this type of differential interface require that the crossing point 406 be maintained at or very near the reference voltage 306. The waveform of FIG. 4 may not meet the specification for the differential interface because the crossing point is spaced away and distant from the reference voltage 306.

Figure 5:
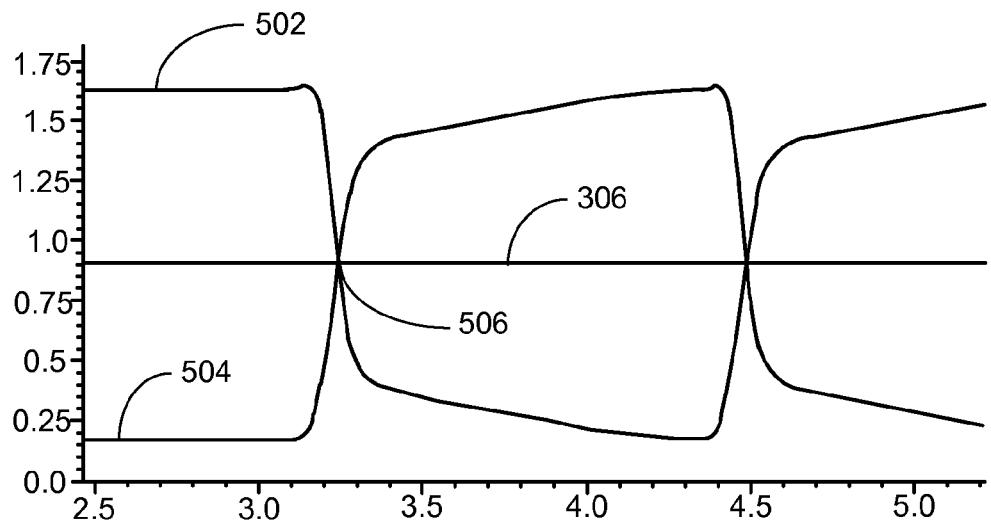
FIG. 5 is a timing diagram of an output waveform sourced from the integrated circuit communication system having transistors outside the nominal process.

Referring now to FIG. 5, therein is shown a timing diagram of an output waveform 500 sourced from the integrated circuit communication system 100 having transistors outside the nominal process. The timing diagram of the output waveform 500 depicts a negative output waveform 502 and a positive output waveform 504.

In the manufacturing process corner that produces pMOS transistors that are characteristically fast and nMOS transistors that are characteristically slow or vice versa. The integrated circuit communication system 100 adjusts the rise and fall times of the transition region 408 to maintain a crossing point 506 to be at the reference voltage 306.

It can be noted that the crossing point 506 is comparable to the nominal case of the specified crossing point 308, of FIG. 3. While the parametric characteristics of the pMOS transistors and the nMOS transistors are from a process region that would normally fail to produce the crossing point 506 at the reference voltage 306, the added circuitry of the integrated circuit communication system 100, of FIG. 1, adjusts the performance to produce the same result found in the nominal process region.

Figure 6:
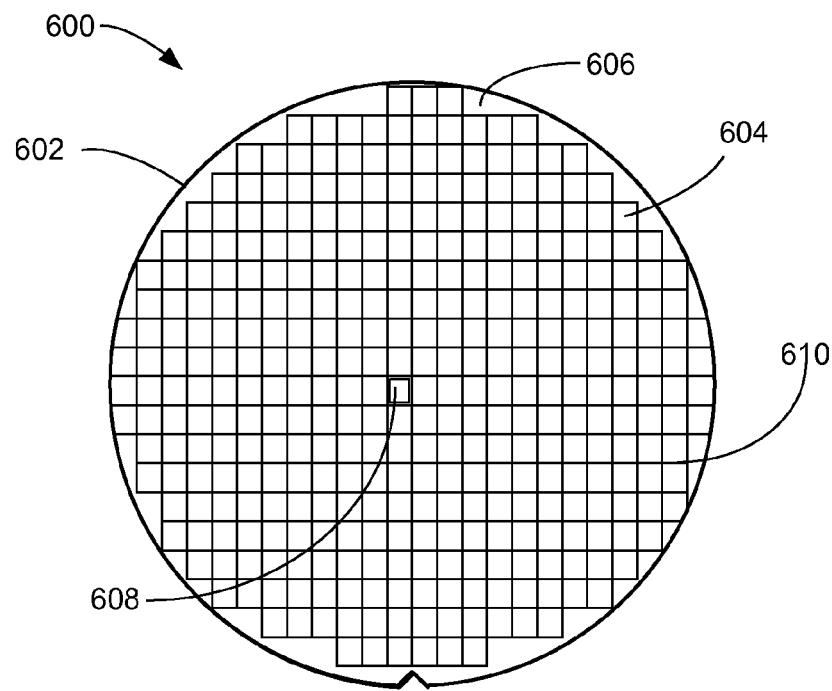
FIG. 6 is a diagram of semiconductor wafer with the integrated circuit communication system formed thereon.

Referring now to FIG. 6, therein is shown a diagram of a semiconductor wafer 600 with the integrated circuit communication system 100 formed thereon. The diagram of the semiconductor wafer 600 depicts a wafer 602, such as a silicon wafer, having integrated circuits 604 patterned on an active surface 606.

A parametric test site 608 may be used in the manufacturing process in order to verify the parametric characteristics of the pMOS transistors (not shown) and the nMOS transistors (not shown). The manufacturing process attempts to control the parametric characteristics through concentration of gasses and temperature controls while growing crystal structures on the wafer 602.

Even with the tightest controls a distribution of the parametric characteristics is assured to take place. The use of the parametric test site 608 and a process control chart (not shown) help to maintain the yield of properly functioning samples of the integrated circuits 604.

A scribe line 610 denotes the path of a singulating tool (not shown), such as a saw, laser, shear, or the like. While the parametric test site 608 may be used to determine the general performance capabilities of the whole wafer, each of the integrated circuits 604 will undergo a circuit test to determine the integrated circuits 604 function properly.

Figure 7:
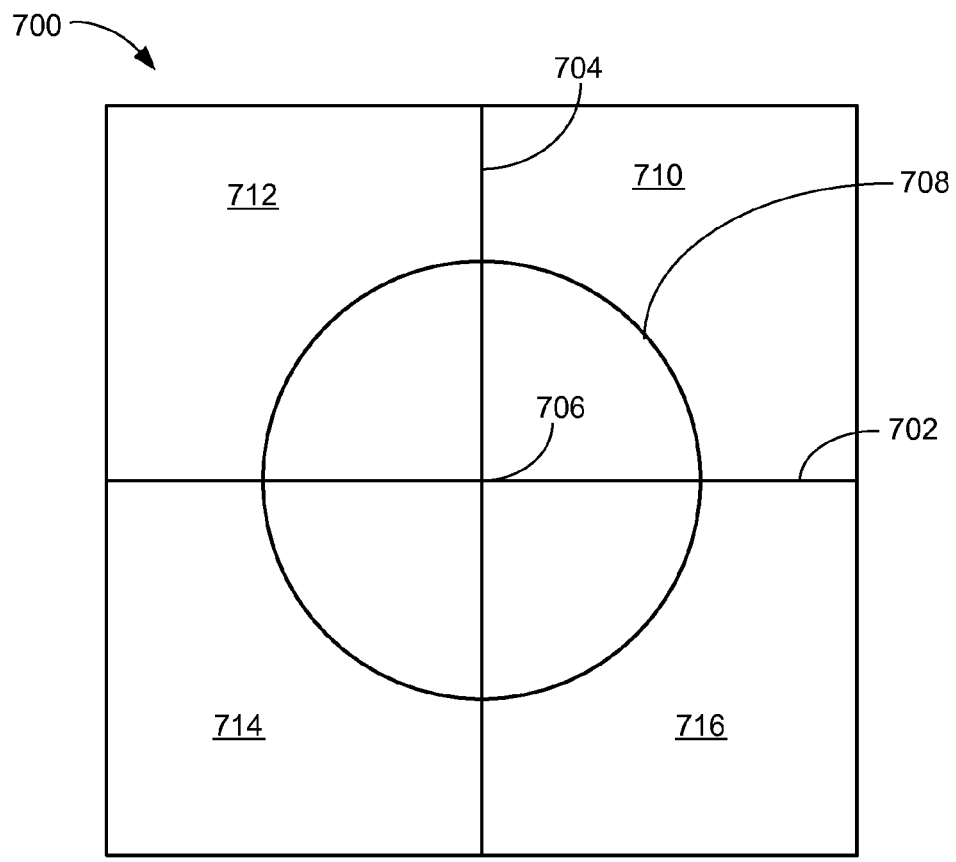
FIG. 7 is a diagram of a process control chart for the semiconductor wafer of FIG. 6.

Referring now to FIG. 7, therein is shown a diagram of a process control chart 700 for the semiconductor wafer 600, of FIG. 6. The diagram of the process control chart 700 may be used to track the parametric characteristics of the semiconductor wafers fabricated by the process. The process control chart 700 depicts a pMOS performance axis 702 and an nMOS performance axis 704.

An intersection 706 of the pMOS performance axis 702 and the nMOS performance axis 704 represents an ideal matching of the parametric characteristics of the pMOS transistors and the nMOS transistors on the semiconductor wafer 600, of FIG. 6. A nominal region 708, such as a circular region centered on the intersection 706, represents the performance ranges that assure meeting the operational specification of a design fabricated on the semiconductor wafer 600 with parametric characteristics that fall in this region.

The pMOS performance axis 702 may represent the relative switching speed of the pMOS transistors in the design with the ideal performance at the intersection 706. The faster performance extends to the right and the slower performance extends to the left.

Similarly the nMOS performance axis 704 is represented by the vertical line through the intersection 706. The faster performance extends up and the slower performance extends down.

The region in the first quadrant but beyond the arc of the nominal region 708 is a fast/fast wafer 710, such as the semiconductor wafer 600 having parametric characteristics that fall in the first quadrant. In the fast/fast wafer 710 the pMOS transistors and the nMOS transistors are faster than the ideal transistors identified at the intersection 706.

While faster performance may work well in some designs, the faster transistors may consume more energy and thus create more heat. There is also the possibility that the difference in performance between the pMOS transistors and the nMOS transistors may expose design limitations and functional failures.

The region in the second quadrant but beyond the arc of the nominal region 708 is a slow/fast wafer 712, such as the semiconductor wafer 600 having parametric characteristics that fall in the second quadrant. In the slow/fast wafer 712 the pMOS transistors are slower and the nMOS transistors are faster than the ideal transistors identified at the intersection 706. The semiconductor wafer 600 from this region is highly susceptible to design failures in the prior art differential driver caused by the unbalanced performance of the transistors.

The region in the third quadrant but beyond the arc of the nominal region 708 is a slow/slow wafer 714, such as the semiconductor wafer 600 having parametric characteristics that fall in the third quadrant. In the slow/slow wafer 714 the pMOS transistors and the nMOS transistors are slower than the ideal transistors identified at the intersection 706.

While slower performance may not work well for all designs, the slower transistors may consume less energy and thus create less heat. There is also the possibility that the difference in performance between the pMOS transistors and the nMOS transistors may expose design limitations and functional failures.

The region in the fourth quadrant but beyond the arc of the nominal region 708 is a fast/slow wafer 716, such as the semiconductor wafer 600 having parametric characteristics that fall in the fourth quadrant. In the fast/slow wafer 716 the pMOS transistors are faster and the nMOS transistors are slower than the ideal transistors identified at the intersection 706. The semiconductor wafer 600 from this region is highly susceptible to design failures in the prior art differential driver caused by the unbalanced performance of the transistors.

Figure 8:
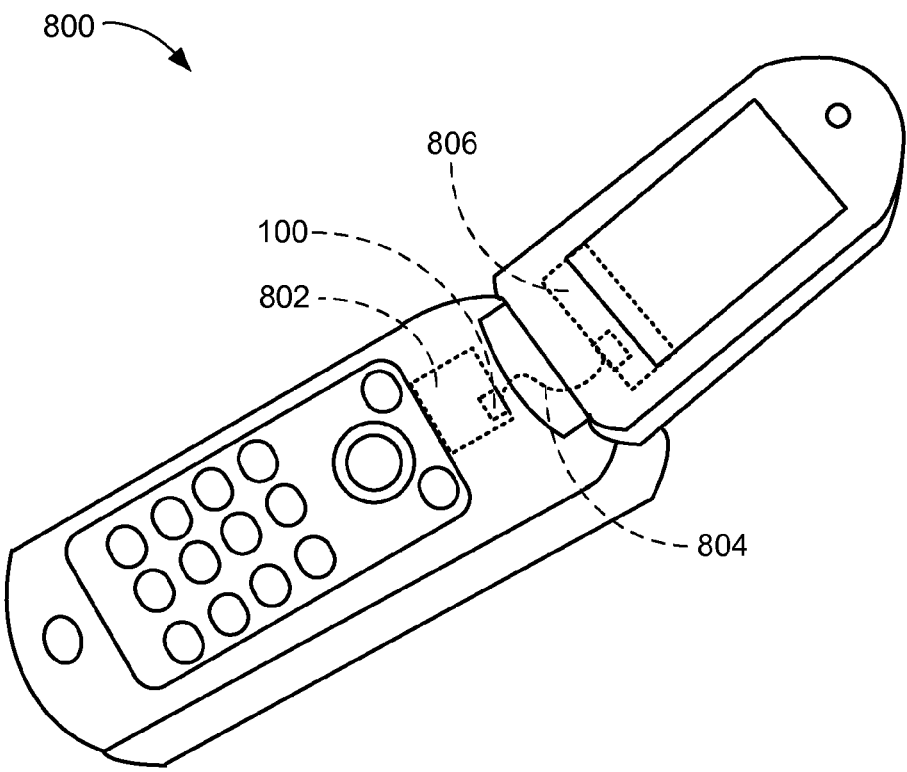
FIG. 8 is a plan view of an electronic device having the integrated circuit communication system in an embodiment of the present invention.

Referring now to FIG. 8, therein is shown a plan view of an electronic device 800 having the integrated circuit communication system 100 in an embodiment of the present invention. The plan view of the electronic device 800 depicts a first integrated circuit 802, such as a microprocessor, having the integrated circuit communication system 100.

A conductive link 804, such as a flex circuit, a cable, printed circuit board traces, or a combination thereof, may be coupled between the first integrated circuit 802 and a second integrated circuit 806. The second integrated circuit 806 may be a display controller, a camera chip, an audio controller, or a combination thereof.

The integrated circuit communication system 100 may provide a more robust design that will allow all wafers to be used without regard to which quadrant of the process control chart they may be attributed. By providing more useable wafers the cost of the individual components is reduced and less material would be relegated to manufacturing scrap.

Figure 9:
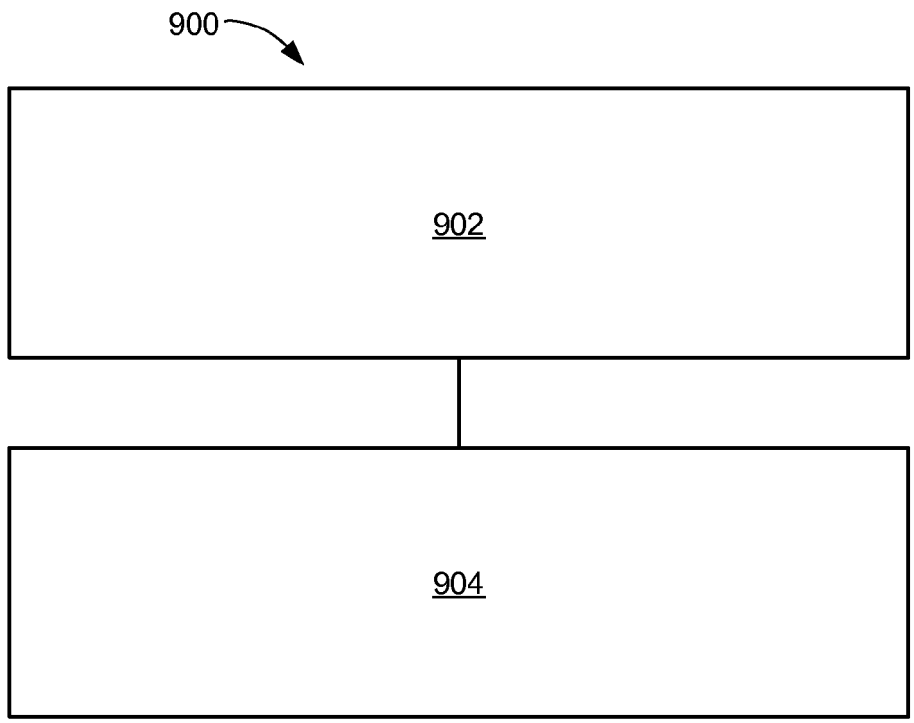
FIG. 9 is a flow chart of a method of manufacture of an integrated circuit communication system in an embodiment of the present invention.

Referring now to FIG. 9, therein is shown a flow chart of a method 900 of manufacture of an integrated circuit communication system 100 in an embodiment of the present invention. The method 900 includes: providing a semiconductor wafer in a block 902; and fabricating a cross-over current mirror driver on the semiconductor wafer for generating a crossing point at a reference voltage in a block 904.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit communication systems fully compatible with conventional manufacturing methods or processes and technologies.

Another important aspect of the present invention is that it valuably supports and services the historical trend of reducing costs, simplifying systems, and increasing performance while reducing material waste in the manufacturing process.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit communication system comprising:
   providing a semiconductor wafer; and
   fabricating a cross-over current mirror driver, having a single ended input circuit coupled to a first current mirror and a second current mirror, on the semiconductor wafer, the first current mirror sourcing a first reference current and the second current mirror sourcing a second reference current for regulating a transition region of a positive output waveform and a negative output waveform.

2. The method as claimed in claim 1 further comprising fabricating a positive output node and a negative output node in the cross-over current mirror driver.

3. The method as claimed in claim 1 wherein providing the semiconductor wafer includes providing a wafer from outside of a nominal region of a process control chart.

4. The method as claimed in claim 1 wherein fabricating the cross-over current mirror driver including fabricating a first transistor, a second transistor, a third transistor, and a fourth transistor includes coupling a fifth transistor, a sixth transistor, a seventh transistor, and an eighth transistor to a standard driver circuit in a cross-coupled configuration.

5. The method as claimed in claim 1 further comprising fabricating an electronic device including:
   providing a first integrated circuit having the cross-over current mirror driver;
   coupling a second integrated circuit to the first integrated circuit; and
   providing a conductive link between the first integrated circuit and the second integrated circuit for signaling by the cross-over current mirror driver.

6. A method of manufacture of an integrated circuit communication system comprising:
   providing a semiconductor wafer having integrated circuits; and
   fabricating a cross-over current mirror driver, having a single ended input circuit coupled to a first current mirror and a second current mirror, in the integrated circuits on the semiconductor wafer for sending a clock, data, or a combination thereof, the first current mirror sourcing a first reference current and the second current mirror sourcing a second reference current for regulating a transition region of a positive output waveform and a negative output waveform.

7. The method as claimed in claim 6 further comprising.;
   fabricating a positive output node and a negative output node in the cross-over current mirror driver for sourcing the positive output waveform and the negative output waveform; and
   coupling an inverter to the cross-over current mirror driver.

8. The method as claimed in claim 6 wherein providing the semiconductor wafer includes providing a wafer from outside of a nominal region of a process control chart including providing a fast/fast wafer, a fast/slow wafer, a slow/slow wafer, or a slow/fast wafer.

9. The method as claimed in claim 6 wherein fabricating the cross-over current mirror driver including fabricating a first transistor, a second transistor, a third transistor, and a fourth transistor includes coupling a fifth transistor, a sixth transistor, a seventh transistor, and an eighth transistor to a standard driver circuit in a cross-coupled configuration including mirroring a current from the sixth transistor to a fourth transistor and from the eighth transistor to a second transistor.

10. The method as claimed in claim 6 further comprising fabricating an electronic device including:
    providing a first integrated circuit having the cross-over current mirror driver including providing a microprocessor;
    coupling a second integrated circuit to the first integrated circuit in which coupling the second integrated circuit includes coupling a display controller, a camera chip, an audio controller, or a combination thereof; and
    providing a conductive link between the first integrated circuit and the second integrated circuit for signaling by the cross-over current mirror driver in which providing the conductive link includes providing a flex circuit, a cable, printed circuit board traces, or a combination thereof.

11. An integrated circuit communication system comprising:
    a semiconductor wafer; and
    a cross-over current mirror driver, with a single ended input circuit, fabricated on the semiconductor wafer, the cross-over current mirror driver including:
      a first current mirror coupled to the single ended input circuit, and
      a second current mirror coupled to the single ended input circuit, the first current mirror sourcing a first reference current and the second current mirror sourcing a second reference current for regulating a transition region of the positive output waveform and the negative output waveform.

12. The system as claimed in claim 11 further comprising a positive output node and a negative output node in the cross-over current mirror driver.

13. The system as claimed in claim 11 wherein the semiconductor wafer includes a wafer from outside of a nominal region of a process control chart.

14. The system as claimed in claim 11 wherein the cross-over current mirror driver with a first transistor, a second transistor, a third transistor, and a fourth transistor includes a fifth transistor, a sixth transistor, a seventh transistor, and an eighth transistor coupled to a standard driver circuit in a cross-coupled configuration.

15. The system as claimed in claim 11 further comprising an electronic device including:
    a first integrated circuit having the cross-over current mirror driver;
    a second integrated circuit coupled to the first integrated circuit; and a conductive link between the first integrated circuit and the second integrated circuit coupled to the cross-over current mirror driver.

16. The system as claimed in claim 11 further comprising integrated circuits, having the cross-over current mirror driver, on the semiconductor wafer for sending a clock, data, or a combination thereof.

17. The system as claimed in claim 16 further comprising a positive output node and a negative output node, in the cross-over current mirror driver, for sourcing the positive output waveform and the negative output waveform.

18. The system as claimed in claim 16 wherein the semiconductor wafer includes a wafer from outside of a nominal region of a process control chart including a fast/fast wafer, a fast/slow wafer, a slow/slow wafer, or a slow/fast wafer.

19. The system as claimed in claim 16 wherein the cross-over current mirror driver with a first transistor, a second transistor, a third transistor, and a fourth transistor includes a fifth transistor, a sixth transistor, a seventh transistor, and an eighth transistor coupled to a standard driver circuit in a cross-coupled configuration including a current mirrored from the sixth transistor to a fourth transistor and from the eighth transistor to a second transistor.

20. The system as claimed in claim 16 further comprising an electronic device including:
  a first integrated circuit having the cross-over current mirror driver in which the first integrated circuit is a microprocessor;
  a second integrated circuit coupled to the first integrated circuit in which the second integrated circuit is a display controller, a camera chip, an audio controller, or a combination thereof; and
  a conductive link between the first integrated circuit and the second integrated circuit coupled to the cross-over current mirror driver in which the conductive link is a flex circuit, a cable, printed circuit board traces, or a combination thereof.

* * * * *